United States Patent [19]

Fu

[11] Patent Number: 5,457,656

[45] Date of Patent: Oct. 10, 1995

[54] ZERO STATIC POWER MEMORY DEVICE REDUNDANCY CIRCUITRY

[75] Inventor: Chien-Chih Fu, Hsinchu, Taiwan

[73] Assignee: United Microelectronics Corp., Hsinchu, Taiwan

[21] Appl. No.: 292,331

[22] Filed: Aug. 17, 1994

[51] Int. Cl.$^6$ .................................................. G11C 7/00
[52] U.S. Cl. .................................. 365/200; 365/225.7
[58] Field of Search .............................. 365/200, 225.7, 365/230.06; 371/10.1, 10.3

[56] References Cited

U.S. PATENT DOCUMENTS 5,379,258  1/1995  Murakami et al. ..................... 365/200

*Primary Examiner*—Joseph A. Popek
*Attorney, Agent, or Firm*—Ladas & Parry

[57] ABSTRACT

A memory redundancy apparatus for replacing defective memory cells in a main memory cell array of a memory device is disclosed. The memory redundancy apparatus operates between two electric potential representing two logic states, and receives a plurality of decoded address signals generated by an input decoding logic to selectively access the redundant memory cells. The memory redundancy apparatus comprises a programmable redundancy decoder logic that receives the address signals and selectively accesses the redundant memory cells to replace the defective memory cells. The memory redundancy apparatus further comprises a redundancy activation circuit coupled to and outputs an activation signal to the programmable redundancy decoder logic so as to activate the operation of the programmable redundancy decoder logic. The disclosed memory redundancy apparatus is capable of zero power consumption when not activated, and the fuse elements necessary to be programmed are relatively few in number.

10 Claims, 4 Drawing Sheets

ZERO STATIC POWER MEMORY DEVICE REDUNDANCY CIRCUITRY

BACKGROUND OF THE INVENTION

1. Field of the Invention

The present invention relates in general to redundancy circuitry for memory devices. In particular, the present invention relates to redundancy circuitry for memory cells in memory devices. More particularly, the present invention relates to redundancy circuitry for memory devices that consumes zero static power.

2. Technical Background

Pursuant to the technological advancements in the fabrication of VLSI memory integrated circuits, the integration density of memory devices is steadily increasing. As the storage capacity per unit area of such memory devices increases, the probability increases that any defects found in the semiconductor during fabrication of such mass memory cells will render a device useless. This directly leads to a decrease of the manufacturing yield rate. To circumvent this yield rate decrease problem associated with the fabrication of large capacity memory devices, on-chip redundant memory cells and their control logic have been proposed. Redundant memory cells and the associated control logic serve to replace defective memory cells found in the semiconductor, so that devices with a limited number of defective memory cells can still be used as qualified memory devices, salvaging the device from otherwise being disposed of.

Reference is made to two U.S. patents, namely, U.S. Pat. No. 4,748,597 issued May 31, 1988, "Semiconductor Memory Device With Redundant Circuits" by Shozo Saito et al., and U.S. Pat. No. 5,146,429 issued Sep. 8, 1992, "Semiconductor Memory Device Including Redundancy Circuitry for Repairing a Defective Memory Cell and a Method for Repairing a Defective Memory Cell" by Shinji Kawai et al.

FIG. 1 of the accompanying drawings shows a schematic diagram of a prior art redundancy circuitry as an example of a circuit employed to solve a memory device having defective memory cells. The memory redundancy circuitry of FIG. 1 comprises two portions, namely the redundancy activation circuit 10 and the programmable redundancy decoder logic 20. The redundancy activation circuit 10 is control circuitry that selectively activates the decoder logic 20 when a memory device is found to be defective. The redundancy activation circuit 10 includes two fuse elements $FE_1$ and $FE_2$, a resistor Z of high impedance, an NMOS transistor NE and two PMOS transistors $PE_1$ and $PE_2$. The programmable redundancy decoder logic 20 is composed of an array of, say n, decoder units 22 each of which includes a fuse element $F_i$ (i=1, 2, ..., n) and an NMOS transistor $T_i$ (i=1, 2, ..., n). Gate terminals of each of the transistor $T_i$ of the decoders 22 are fed by address signals $X_i$ (i=1, 2, ..., n) of the memory device in question. As used in the art, a fuse element means a conduction path on the semiconductor that can be deliberately destroyed (blown) by a laser beam in order to configure or program different functions for the semiconductor. In the instant case, the configuration or programming results in a substitution of reserve memory cells for defective ones.

Before the memory redundancy circuitry, as shown in FIG. 1, of a memory device, is selected and activated, the electric potential of node A of the redundancy activation circuit 10 is maintained at a high voltage level ($V_{CC}$) due to the presence of the fuse $FE_1$ being connected to $V_{CC}$ and resistor Z being of high impedance and connected to the ground potential of the system. On the other hand, the potential of node B of the programmable redundancy decoder logic 20 is maintained at the low level (GND) due to the presence of the series-connected fuse element $F_i$ and transistor $T_i$ of each decoder unit 22, which is connected to the ground potential. In this condition of the device, the potential of the redundancy activation status signal $\overline{RD}$ outputted from redundancy activation status output stage 25 is maintained at the high level.

When the memory redundancy circuitry of FIG. 1 is selected and activated, so as to replace certain defective main memory cells in the device, all the fuse elements $F_i$ in the programmable redundancy decoder logic 20 are deliberately blown. The fuse elements $FE_1$ and $FE_2$ of the redundancy activation circuit 10 are blown as well. In this condition of the device, node A goes to a low signal level, as well as the $\overline{CE}$ (chip enable) signal. The two PMOS transistors $PE_1$ and $PE_2$ go into conduction as a result making node B to go to a high level. When node B is goes to a high level, the redundancy activation status signal RD is driven to a low level, indicating that the operation of the memory device is conducted in the redundant memory cell array, not the main memory cell array. When node B is at a low level, $\overline{RD}$ maintains its high signal level, indicating that the operation is conducted in the normal memory cell array, not in the redundancy.

However, due to the fact that the memory redundancy circuitry shown in FIG. 1 of the exemplified prior art conserves only the fuse elements of the redundant bits that correspond to those in the normal memory cell array that are defective, all other fuse elements of the redundant bits that correspond to all the good bits are blown. In other words, in most of the occasions, most of the fuse elements in the programmable redundancy decoder logic 20 are required to be blown, because relatively fewer defective memory cells than normal ones are found in the typical memory device. That means, this prior art requires more fuse elements to be blown than those that should be maintained intact. More fuse blowing represents higher possibility of erroneous programming. Some of the fuses may not be completely blown, triggering decoding errors.

Moreover, when the all the memory cells are perfect in the normal, or in other words, in the main memory cell array, then since the memory redundancy circuitry of FIG. 1 need not be activated, all the fuse elements are remained unblown. That is to say, both fuse elements $FE_1$ and $FE_2$ in the redundancy activation circuit 10 and all fuse elements $F_i$ in the programmable redundancy decoder logic 20 are kept intact. This results in currents flowing through the resistor Z and the PMOS transistors $PE_1$ and $PE_2$ of the redundancy activation circuit 10, as well as through all the transistors $T_i$ of the programmable redundancy decoder logic 20. This is an obvious waste of power, a penalty to memory devices having no defects in their main memory cell arrays.

SUMMARY OF THE INVENTION

The present invention provides a memory device redundancy circuitry that consumes no electric power when not being selected and activated.

In another aspect of the invention, there is provided a memory device redundancy circuitry that requires the blowing of fewer fusing elements to improve the accuracy of the programing as well as the reliability of the programmed redundancy logic.

BRIEF DESCRIPTION OF THE DRAWING

Other objects, features, and advantages of the present invention will become apparent by way of the presentation of the following detailed description of the preferred but non-limiting embodiments, with references to the accompanied drawings, wherein.

DETAILED DESCRIPTION OF THE PREFERRED EMBODIMENT

Figure 1:
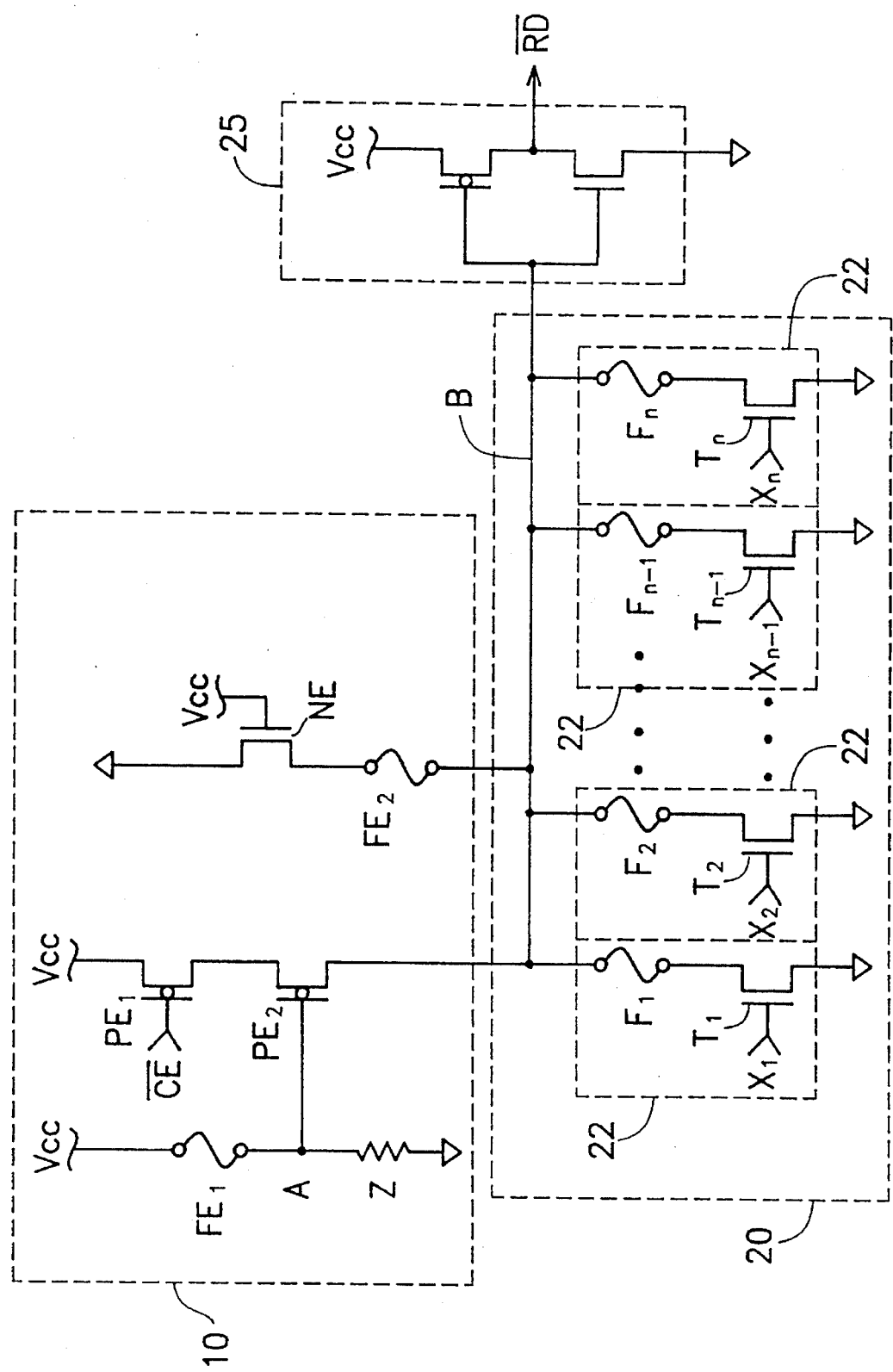
FIG. 1 is a schematic diagram of a prior art redundancy circuitry for memory device.
Figure 2:
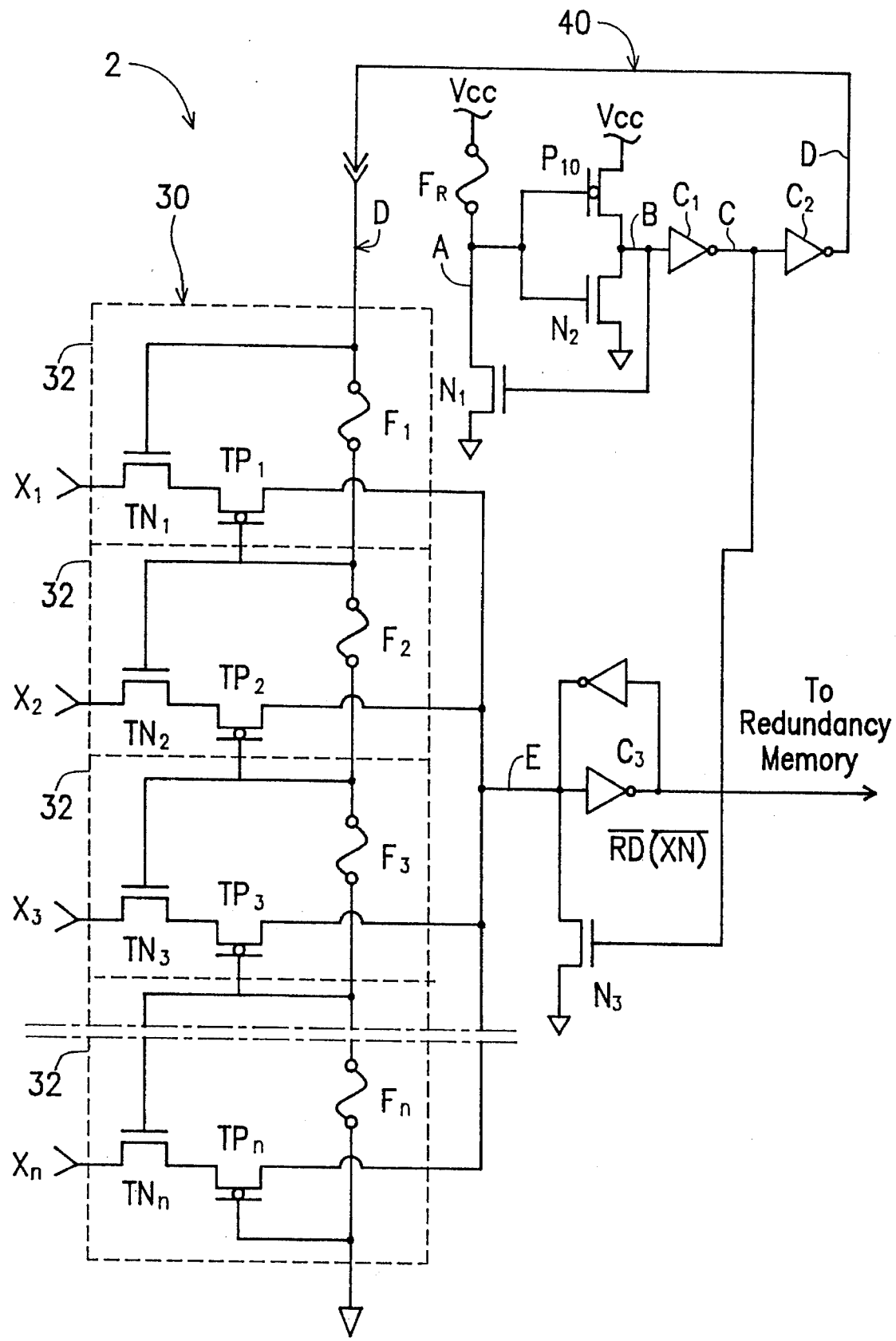
FIG. 2 is the schematic diagram of a memory redundancy circuitry in accordance with the present invention.
Figure 3:
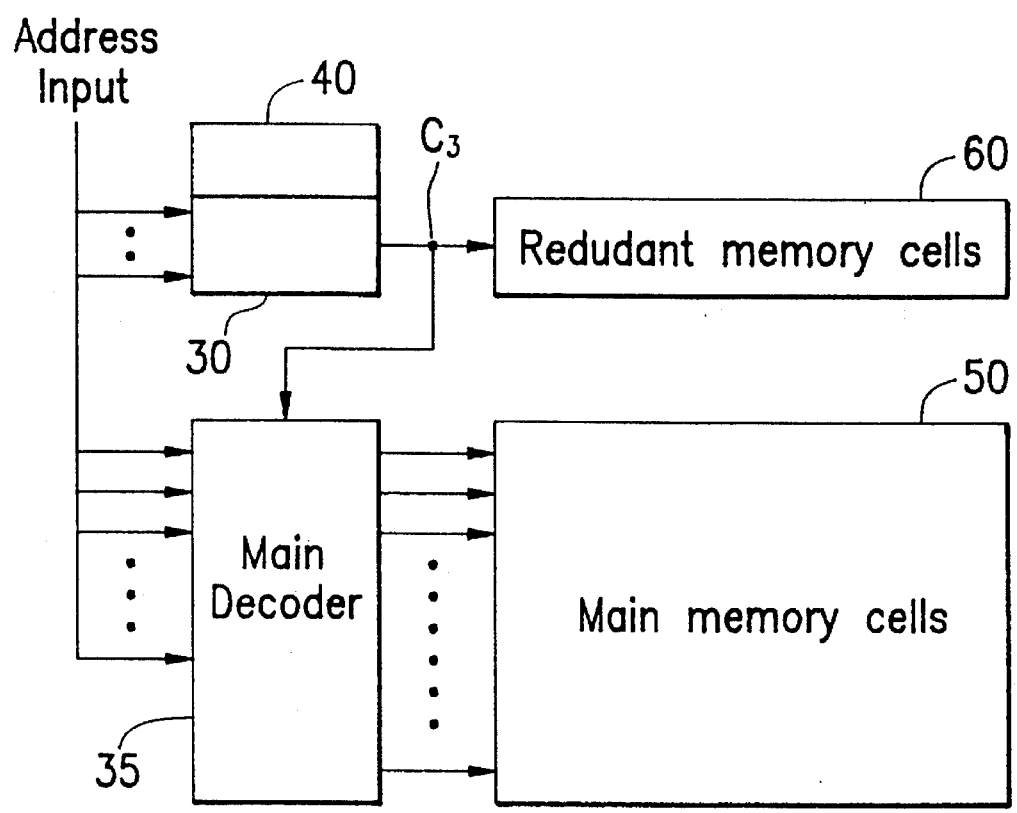
FIG. 3 is a block diagram of the entire structure of a semiconductor memory device comprising a memory redundancy circuit in accordance with the present invention.

Reference is now made to FIG. 2 in which the schematic diagram of a memory redundancy circuitry in accordance with the present invention ms shown. The memory redundancy circuitry 2 of the present invention is suitable for being utilized by a main memory cell array 50 of a semiconductor memory device, as shown in FIG. 3, namely a memory integrated circuit device, for backing up the main memory cell array 50 by providing redundant memory cells 60 and their activation circuitry 40. Also referring to FIG. 3, the programmable redundancy decoder logic 30 is activated by the redundancy activation circuitry 40 when the main memory cells 50 have some failed cells need to be replaced by the redundant memory cells 60. The programmable redundancy decoder logic 30 will enable the redundant memory cells if the input address signals match the failed main memory cells row's or column's decoders 35. Meanwhile, the programmable redundancy decoder logic 30 will disable the main memory cells row's or column's decoders 35.

The memory redundancy circuitry 2, which comprises the redundancy activation circuit 40 and programmable redundancy decoder logic 30, operates between two electric potentials, i.e., the high ($V_{CC}$) and low (GND) levels, together with its host main memory cell array of the entire memory device. The memory redundancy circuitry 2 accepts the plurality of address bit signals $X_i$ (i=1, 2, . . . , n) generated by an input circuitry (for example, an address decoder, as shown in FIG. 3) as inputs for the plurality of decoder units 32 of the programmable redundancy decoder logic 30. The input address bits are for selecting the redundant memory cells (as shown in FIG. 3) that can replace the defective memory cells in the main memory cell array 50.

At this moment, it is necessary to indicate the fact that only 4 decoder units 32 are shown in FIG. 2 for clarity of the description. More than 4 decoder units 32 is certainly possible.

Each decode unit 32 comprises a first switch element, which is an NMOS transistor $TN_i$, a second switch element, the PMOS transistor $TP_i$, and a fuse element $F_i$. As can be seen in FIG. 2, the fuse elements $F_i$ of all the decoder units 32 are connect in series, with one end of the series connected fuse element chain connected to ground potential, and the other end to the D node of the redundancy activation circuit 40. The NMOS and PMOS transistors, $TN_i$ and $TP_i$ in each decoder unit 32, are also connected in series, one end of which accepts the $X_i$ address input, and the other end of which is tied together with the other of the series connected transistor pairs to form a node E. The signal at node E is inverted by inventor $C_3$ which feeds the redundant memory cells. The gate of the NMOS transistor $TN_i$ in each decoder unit 32 is connected to one end of its fuse element $F_i$, and the gate of the PMOS transistor $TP_i$ is connected to the other end of $F_i$.

Figure 4:
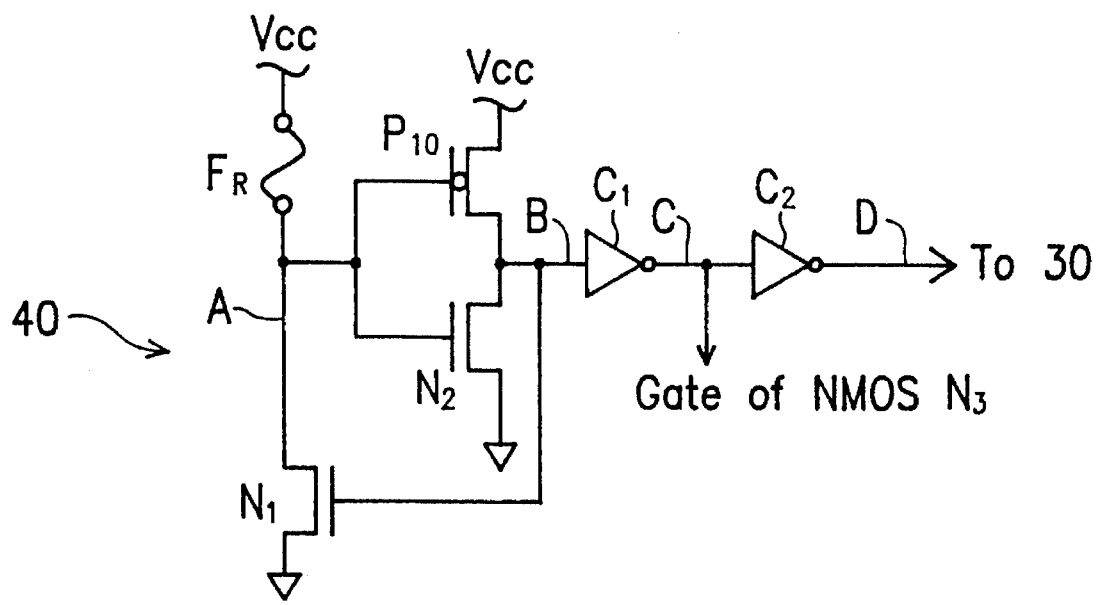
FIG. 4 is the schematic diagram of a first embodiment of the redundancy activation status output circuit for a memory redundancy circuitry in accordance with the present invention.

Reference is now made to FIG. 4 in which is shown the schematic diagram of a first embodiment of the redundancy activation circuit 40 for a memory redundancy circuitry 2, such as the one of FIG. 2. The redundancy activation circuit 40 includes a fuse element $F_R$, a PMOS transistor $P_{10}$, two NMOS transistors $N_1$ and $N_2$, and two inverters $C_1$ and $C_2$. As can be seen in the drawing, the fuse element $F_R$ is connected in series with the NMOS transistor $N_1$, with the other end of fuse element $F_R$ tied to $V_{CC}$, and the transistor end tied to ground. The PMOS transistor $P_{10}$ and the other NMOS transistor $N_2$ are also connected in series, with the PMOS end of this connection tied to $V_{CC}$ and the NMOS end tied to ground. The gates of the $P_{1O}$ and $N_2$ transistors are tied together and are connected to the joint node A of the fuse element $F_R$ and transistor $N_1$ series connection. The gate of the transistor $N_1$ is connected to the joint node B of the $P_{10}$ and $N_2$ transistor series connection, and is further connected to the input of the first inverter $C_1$. The input of the second inverter $C_2$ is fed by the output of the first inverter $C_1$.

In the first embodiment of the redundancy activation circuit 40 of FIG. 4, the channel region width-to-length W/L ratio of the NMOS transistor $N_1$ is preferably larger than that of the other NMOS transistor $N_2$. For example, the W/L ratio of $N_1$ can be 20/1, and 1/20 for $N_2$. Such non-symmetry of the transistor geometry in the latching circuit helps to stabilize a low level electric potential at node A and a high level at node B, when the fuse element $F_R$ is blown-open. Note should be made that no electric power is consumed under this condition.

Figure 5:
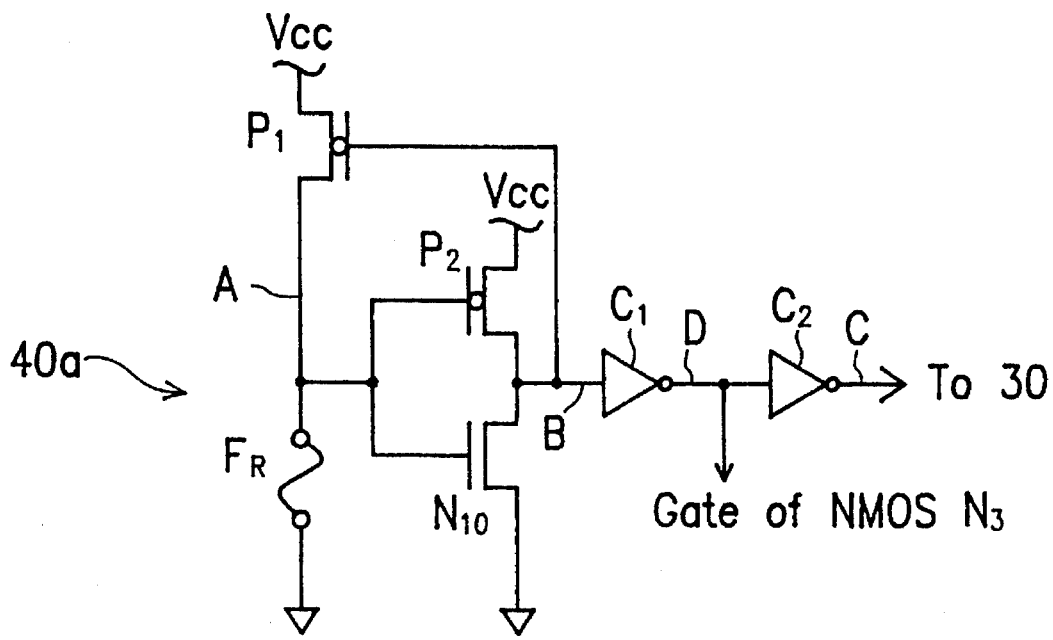
FIG. 5 is the schematic diagram of a second embodiment of the redundancy activation status output circuit for a memory redundancy circuitry in accordance with the present invention.

Reference is now made to FIG. 5, wherein the schematic diagram of a second embodiment of the redundancy activation circuit 40 for a memory redundancy circuitry 2 is shown. When compared to the embodiment of FIG. 4, the redundancy activation circuit 40a comprises similar components, but the series connection arrangement of the fuse element $F_R$ and the associated series transistor is different. The transistor $P_1$ is a PMOS transistor, which has one of its ends, i.e. its end not connected to the fuse element $F_R$, tied to $V_{CC}$. The fuse element $F_R$, is tied to ground potential. Other than this, the circuitry configuration is similar to that of the redundancy activation circuit 40 of FIG. 4. Moreover, the channel region W/L ratio of the PMOS transistor $P_1$ is similarly preferably 20/1, while that for the other PMOS transistor $P_2$ is similarly preferably 1/20. As is previously described above, such geometrical arrangement can help maintain logic levels at nodes A and B and achieve zero power consumption when the fuse element $F_R$ is blown-open.

The following will describe the operation of the memory redundancy circuitry 2 of the present invention shown in FIG. 2.

When the memory redundancy circuitry 2 of FIG. 2 is not selected, or in other words, not activated, to replace the defective memory cells utilizing the redundant memory cells in circuitry 2, the fuse element $F_R$ is not blown. In this case, the potential of node A is at its high level ($V_{CC}$), and the NMOS transistor $N_2$ is in a conduction mode to pull node B to the GND potential. Meanwhile, the other NMOS transistor $N_1$ is maintained in non-conduction mode, helping to maintain the potential of node A at the high level. In this condition, the electric potential of node C is also at high level, making the third NMOS transistor $N_3$ go into a conduction mode, which in turn pulls the potential of node E to the GND potential. This inverts the redundancy activation status signal $\overline{RD}$ into a high level, indicating a non-activated status of the memory redundancy circuitry 2.

In addition, node D is at a low level, and as a result, the PMOS transistor $TP_1$ conducts, while the NMOS transistor $TN_1$ is not conducting, thereby blocking the signal path of the address signal $X_1$.

On the other hand, when the memory redundancy circuitry 2 of FIG. 2 is selected and activated, the fuse element $F_R$ is blown open. Each of the fuse elements $F_i$, say $F_2$ for example, of the decoder unit 32 in the programmable redundancy decoder logic 30 that correspond to a defective memory cell in the main memory cell array are also blown. At this instant, node A is at a low electric potential, making the PMOS transistor $P_{10}$ conduct. The conduction of $P_{10}$ brings node B to the high potential level, which also makes the NMOS transistor $N_1$ conducts, so that node A is ensured to be maintained at a low potential level. Meanwhile, node C is low, cutting off the NMOS transistor $N_3$. Since node D is high, and since fuse element $F_2$ has been blown open, only NMOS and PMOS transistors $TN_2$ and $TP_2$ are in their conduction mode, because the gate of $TN_2$ is high and the gate of $TP_2$ is low. No other transistor pair are in this condition. This allows only the properly decoded address bit signal $X_2$ to access the redundant memory cell, replacing its defective original part.

Due to the fact that the present invention requires only the blowing open of the fuse elements of those decoder units that address the redundant memory cells, the programming fuses are few in number, making the possibility of programming error as low as possible. Also, and of major importance, the memory redundancy circuitry of FIG. 2 does not consume electric power when there is no necessity of making use of the redundancy circuitry. Therefore, the spare logic is truly spare, which is the best possible design strategy. Even when the redundancy circuitry is in use, there is also no un-necessary electric currents flowing in the logic to consume extra electric power.

It should be noted that although the embodiments in the description of this specification have exemplified specific components for the inventive concept of the present invention, it is apparent to persons skilled in this art that, with appropriate modifications to the exemplified embodiments, different circuitries can be built without departing from the spirit and scope of the present invention.

I claim:

1. A memory redundancy apparatus for replacing defective memory cells in a main memory cell array by redundant memory cells of a memory device, said memory redundancy apparatus operating between a first and a second electric potential and receiving a plurality of decoded address signals generated by an input decoding logic to selectively access said redundant memory cells, said memory redundancy apparatus comprising:

a programmable redundancy decoder logic that receives said address signals and selectively accesses said redundant memory cells to replace said defective memory cells; and a redundancy activation circuit coupled to said programmable redundancy decoder logic for outputting an activation signal to said programmable redundancy decoder logic so as to activate the operation of said programmable redundancy decoder logic; and wherein:

said programmable redundancy decoder logic comprises a plurality of decoder units, each said decoder unit including a first switching element, a second switching element, and a fuse element;

said fuse elements of each of said decoder units are connected in series, with a first end of said connected series of fuse elements connected to said redundancy activation circuit, and the second end of said connected series of fuse elements connected to said second electric potential; and said first and second switching elements in each of the decoder units are connected in series with one end of the switching element series receiving the corresponding one of said input address signals, while the other end of the switching element series is connected to the corresponding one of said redundancy memory cells, and control terminals of the two switching elements in each of said decoder units are connected respectively to each end of said fuse element in the same decoder unit.

2. The memory redundancy apparatus of claim 1, wherein said first of said two switching elements is an NMOS transistor, said second of said two switching elements is a PMOS transistor, and said control terminals of said two switching elements are the control gates of said NMOS and PMOS transistors.

3. The memory redundancy apparatus of claim 2, wherein: :

said redundancy activation circuit comprises a main fuse element, a first MOS transistor of a first type, a second MOS transistor of the first type, a MOS transistor of a second type, and at least one inverter having an input;

said main fuse element and said first MOS transistor of the first type are series connected, by means of a connecting joint, between said two electric potentials;

the gates of said MOS transistor of the second type and said second MOS transistor of the first type are connected to the connecting joint of said main fuse element and said first MOS transistor of the first type;

the gate of said first MOS transistor of the first type is connected to a connection joint of said MOS transistor of the second type, said second MOS transistor of the first type, and the input of said inverter; and the output of said inverter is connected to said first end of said connected series of fuse elements in said programmable redundancy decoder logic.

4. The memory redundancy apparatus of claim 3, wherein said MOS transistor of the first type is PMOS transistor, and said MOS (transistor of the second type is NMOS transistor.

5. The memory redundancy apparatus of claim 4, wherein the PMOS transistor W/L ratio of said first PMOS transistor is larger than the PMOS transistor W/L ratio of said second PMOS transistor, said PMOS transistor W/L ratio defining a ratio of PMOS transistor channel region width to PMOS transistor channel region length.

6. The memory redundancy apparatus of claim 5, wherein the PMOS transistor W/L ratio of said first PMOS transistor is about 20/1 and the PMOS transistor W/L ration of said second PMOS transistor is about 1/20.

7. The memory redundancy apparatus of claim 1, wherein:

said redundancy activation circuit comprises a main fuse element, a first MOS transistor of a first type, a second MOS transistor of the first type, a MOS transistor of a second type, and at least one inverter having an input;

said main fuse element and said first MOS transistor of the first type are series connected, by means of a connecting joint, between said two electric potentials;

the gates of said MOS transistor of the second type and said second MOS transistor of the first type are connected to the connecting joint of said main fuse element and said first MOS transistor of the first type;

the gate of said first MOS transistor of the first type is connected to a connection joint of said MOS transistor of the second type, said second MOS transistor of the first type, and the input of said inverter; and the output of said inverter is connected to said first end of said connected series of fuse elements in said programmable redundancy decoder logic.

8. The memory redundancy apparatus of claim 7, wherein: said MOS transistor of the first type is NMOS transistor, and said MOS transistor of the second type is PMOS transistor.

9. The memory redundancy apparatus of claim 8, wherein an NMOS transistor W/L ratio of said first NMOS transistor is larger than the NMOS transistor W/L ratio of said second NMOS transistor, said NMOS transistor W/L ratio defining a ratio of NMOS transistor channel region width to NMOS transistor channel region length.

10. The memory redundancy apparatus of claim 9, wherein the NMOS transistor W/L ratio of said first NMOS transistor is 20/1 and the NMOS transistor W/L ratio of said second NMOS transistor is 1/20.

* * * * *